(12) United States Patent
Abe et al.

(10) Patent No.: US 9,420,642 B2
(45) Date of Patent: Aug. 16, 2016

(54) LIGHT EMITTING APPARATUS AND LIGHTING APPARATUS

(71) Applicant: PANASONIC INTELLECTUAL PROPERTY MANAGEMENT CO., LTD., Osaka (JP)

(72) Inventors: Masumi Abe, Osaka (JP); Toshifumi Ogata, Osaka (JP); Atsuyoshi Ishimori, Osaka (JP); Kenji Sugiura, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/828,586

(22) Filed: Aug. 18, 2015

(65) Prior Publication Data
US 2016/0081142 A1    Mar. 17, 2016

(30) Foreign Application Priority Data

Sep. 11, 2014   (JP) .................................. 2014-185185

(51) Int. Cl.
| H01J 1/62 | (2006.01) |
| H05B 33/04 | (2006.01) |
| H05B 33/10 | (2006.01) |

(52) U.S. Cl.
CPC ................ *H05B 33/04* (2013.01); *H05B 33/10* (2013.01)

(58) Field of Classification Search
CPC ................................. H05B 33/04; H05B 33/10
USPC .......................................... 313/506, 504, 512
See application file for complete search history.

(56) References Cited

U.S. PATENT DOCUMENTS

| 8,183,772 B2 * | 5/2012 | Ray .......................... G09G 3/30 |
| | | 313/169 |
| 2006/0012299 A1 * | 1/2006 | Suehiro ................... H01L 33/20 |
| | | 313/512 |
| 2015/0049480 A1 | 2/2015 | Ogata et al. |

FOREIGN PATENT DOCUMENTS

JP     2011-146640    7/2011

* cited by examiner

*Primary Examiner* — Vip Patel
(74) *Attorney, Agent, or Firm* — Greenblum & Bernstein, P.L.C.

(57) ABSTRACT

Light emitting apparatus including: substrate; LED chips on substrate; first sealing layer sealing LED chips; second sealing layer above first sealing layer; and phosphor layer containing yellow phosphor, disposed between first sealing layer and second sealing layer, wherein phosphor layer contains the yellow phosphor in higher density than first sealing layer and second sealing layer.

9 Claims, 8 Drawing Sheets

LIGHT EMITTING APPARATUS AND LIGHTING APPARATUS

CROSS REFERENCE TO RELATED APPLICATION

This application claims the benefit of priority of Japanese Patent Application Number 2014-185185, filed Sep. 11, 2014, the entire content of which is hereby incorporated by reference.

BACKGROUND OF THE INVENTION

1. Field of the Invention

The present disclosure relates to a light emitting apparatus in which light emitting elements are mounted on a substrate, and a lighting apparatus using the light emitting apparatus.

2. Description of the Related Art

A semiconductor light emitting element, such as a light emitting diode (LED), is widely utilized as a highly efficient, space-saving light source in various lighting apparatuses for lighting applications, display applications, etc.

A COB (chip on board) light emitting apparatus (a light emitting module) in which an LED mounted on a substrate is sealed with a phosphor-containing resin, and a light emitting apparatus using a packaged SMD (surface mount device) light emitting element are also known (see Japanese Unexamined Patent Application Publication No. 2011-146640, for example).

SUMMARY OF THE INVENTION

In such a light emitting apparatus as described above, phosphor degrades in use, ending up with shifting the chromaticity of the light emitting apparatus.

Thus, the present disclosure provides a light emitting apparatus, etc., which suppress degradation of phosphor.

A light emitting apparatus according to one aspect of the present disclosure includes: a substrate; a light emitting element on the substrate; a first sealing layer sealing the light emitting element; a second sealing layer above the first sealing layer; and a phosphor layer between the first sealing layer and the second sealing layer, the phosphor layer containing phosphor, wherein the phosphor layer contains the phosphor in higher density than the first sealing layer and the second sealing layer.

A method for fabricating a light emitting apparatus according to one aspect of the present disclosure includes: (a) mounting a light emitting element on a substrate; (b) forming a first sealing layer sealing the light emitting element; and (c) forming a phosphor layer containing phosphor above the first sealing layer, and forming a second sealing layer above the phosphor layer, wherein the phosphor layer contains the phosphor in higher density than the first sealing layer and the second sealing layer.

According to the present disclosure, a light emitting apparatus, etc., which suppress degradation of phosphor is achieved.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE PREFERRED EMBODIMENTS

Hereinafter, a light emitting apparatus, etc., according to exemplary embodiments of the present disclosure are to be described, with reference to the accompanying drawings. The exemplary embodiments described below are each general and specific illustration. Values, shapes, materials, components, and arrangement and connection between the components, steps, and the order of the steps shown in the following exemplary embodiments are merely illustrative and not intended to limit the present disclosure. Therefore, among the components in the exemplary embodiments below, components not recited in any one of the independent claims indicating the top level concept of the present disclosure are described as arbitrary components.

Figures are schematic views and do not necessarily illustrate the present disclosure precisely. In the figures, the same reference signs are used to refer to substantially the same configuration, and thus duplicate description may be omitted or simplified.

Embodiment 1

[Configuration of Light Emitting Apparatus]

Figure 1:
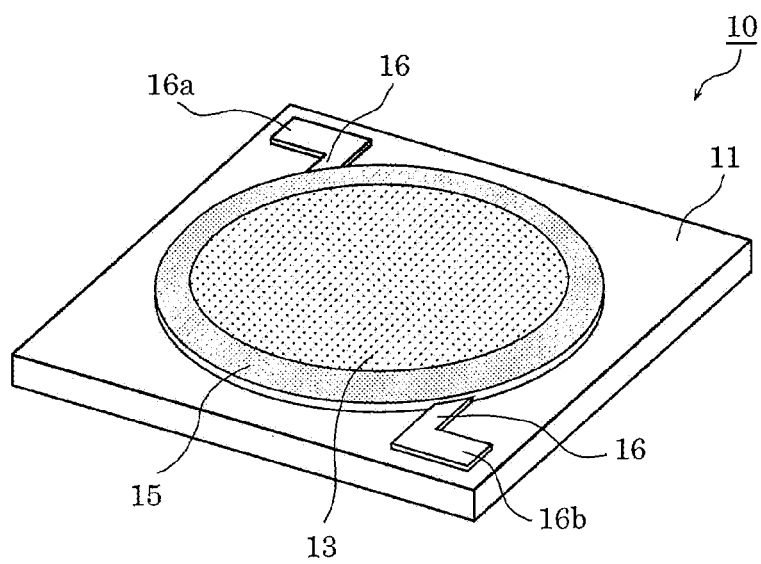
FIG. 1 is an external perspective view of a light emitting apparatus according to Embodiment 1.
Figure 2:
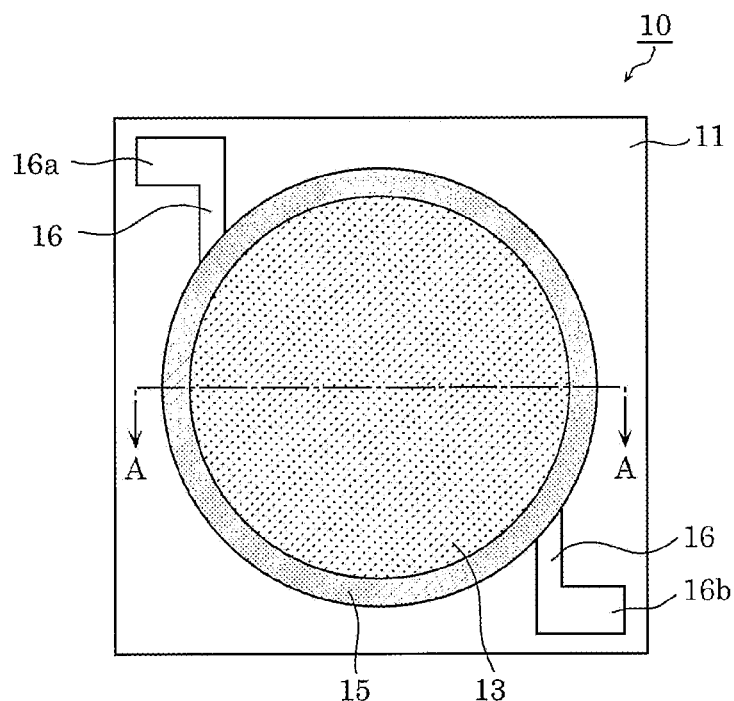
FIG. 2 is a plan view of the light emitting apparatus according to Embodiment 1.
Figure 3:
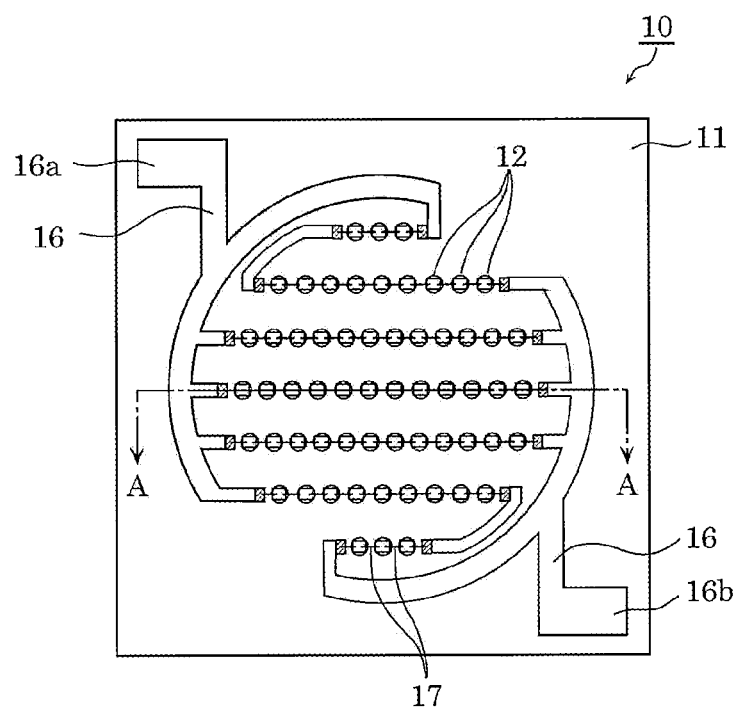
FIG. 3 is a plan view showing the internal structure of the light emitting apparatus according to Embodiment 1.
Figure 4:
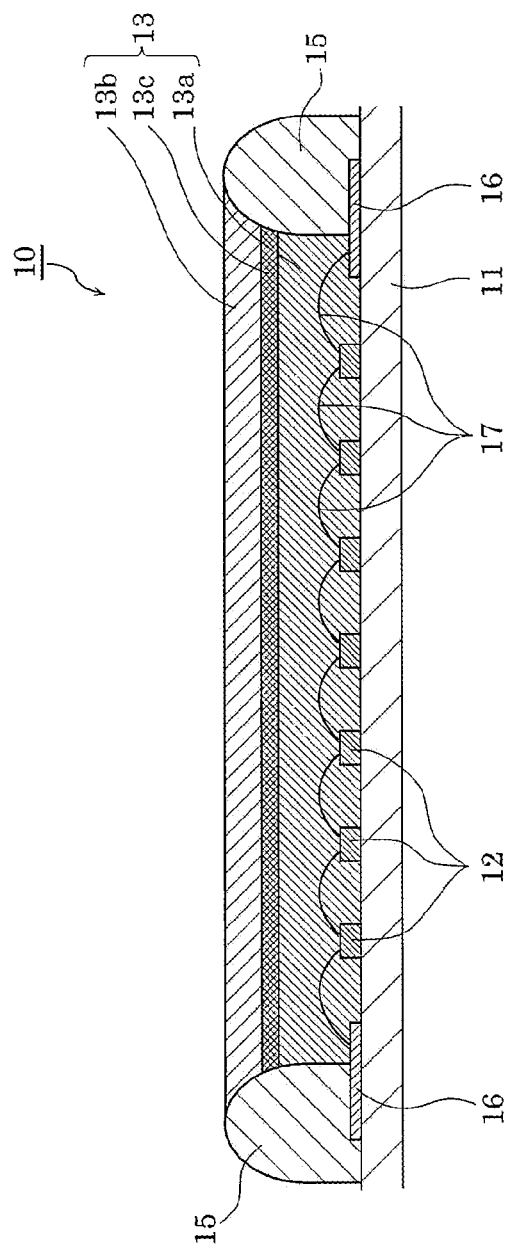
FIG. 4 is a schematic cross-sectional view of the light emitting apparatus, taken along A-A in FIG. 2.

First, a configuration of a light emitting apparatus according to Embodiment 1 is described, with reference to the accompanying drawings. FIG. 1 is an external perspective view of the light emitting apparatus according to Embodiment 1. FIG. 2 is a plan view of the light emitting apparatus according to Embodiment 1. FIG. 3 is a plan view showing the internal structure of the light emitting apparatus according to Embodiment 1. FIG. 4 is a schematic cross-sectional view of the light emitting apparatus, taken along A-A in FIG. 2. It should be noted that FIG. 3 is a plan view of the light emitting apparatus from which sealing member 13 and dam material 15 in FIG. 2 are excluded, showing the internal structure, such as arrangement of LED chips 12 and an interconnection pattern. FIG. 4 is a schematic cross-sectional view, and thus some configuration, such as the number of LED chips 12, for example, may not be consistent with that in FIG. 2.

As shown in FIGS. 1 through 4, light emitting apparatus 10 according to Embodiment 1 includes substrate 11, a plurality of LED chips 12, sealing member 13, and dam material 15.

Light emitting apparatus 10 is, what is known as, a COB (chip-on-board) LED module in which LED chips 12 are directly mounted on substrate 11.

Substrate 11 has an interconnect region in which line 16 is included. Line 16 (and electrodes 16a and 16b) is a metal line for supplying LED chips 12 with power. Substrate 11 is, for example, a metal base substrate or a ceramic substrate. Alternatively, substrate 11 may be a resin substrate based on a resin.

If substrate 11 is a ceramic substrate, the ceramic substrate is an alumina substrate comprising aluminum oxide (alumina), or an aluminum nitride substrate comprising aluminum nitride, or the like. If substrate 11 is a metal base substrate, the metal base substrate is an aluminum alloy substrate, an iron alloy substrate, a copper alloy substrate, or the like, which has an insulating film formed on its surface, for example. If substrate 11 is a resin substrate, the resin substrate is, for example, a glass-epoxy substrate comprising fiberglass and an epoxy resin.

For example, substrate 11 may be one that has high optical reflectance (e.g., optical reflectance of 90% or higher). Substrate 11 having high optical reflectance can reflect light emitted by LED chips 12 off the surface of substrate 11. As a result, the efficiency of light emitting apparatus 10 in extracting light is enhanced. Examples of such a substrate include a white ceramic substrate based on alumina.

Alternatively, substrate 11 may be a translucent substrate having high light-transmittance. Examples of such a substrate include a translucent ceramic substrate comprising polycrystalline alumina or aluminum nitride, a transparent glass substrate comprising glass, a quartz substrate comprising quartz, a sapphire substrate comprising sapphire, and a transparent resin substrate comprising a transparent resin material.

While substrate 11 is formed in a rectangular shape in Embodiment 1, it may be formed in any other shape, such as a circular shape.

LED chip 12 is by way of example of a light emitting element, and is a blue LED chip which emits blue light. LED chip 12 is, for example, a gallium-nitride-based LED chip comprising InGaN-based material, having a center wavelength (a peak wavelength of emission spectrum) of 430 nm or greater and 480 nm or less.

A plurality of lines of the light emitting elements, each element configured of LED chip 12, are disposed on substrate 11. As shown in FIG. 3, structurally, seven lines of light emitting elements are disposed on substrate 11 so as to conform to a circular shape.

Five lines of light emitting elements, each line including twelve LED chips 12 connected in series, are electrically disposed on substrate 11. The five lines of light emitting elements are connected in parallel, and emit light as power is supplied between electrode 16a and electrode 16b.

Moreover, although not shown in detail, Chip To Chip interconnection is established, mainly by bonding wires 17 between LED chips 12 which are connected in series (some of LED chips 12 are connected by line 16). Bonding wires 17 are connected to LED chips 12 to supply them with power. Bonding wires 17, and line 16, and electrodes 16a and 16b described above, include metallic materials comprising, for example, gold (Au), silver (Ag), copper (Cu), or the like.

Dam material 15 is for holding back sealing member 13 disposed on substrate 11. Dam material 15, for example, comprises a thermoset resin, a thermoplastic resin, or the like which has insulation properties. More specifically, dam material 15 comprises a silicone resin, a phenolic resin, an epoxy resin, a BT resin, PPA, or the like.

Desirably, dam material 15 has optical reflectivity to enhance the efficiency of light emitting apparatus 10 in extracting light. Thus, a white-colored resin (what is known as a white resin) is used as dam material 15 in Embodiment 1.

It should be noted that, to enhance the optical reflectivity of dam material 15, dam material 15 may include particles of $TiO_2$, $Al_2O_3$, $ZrO_2$, $MgO$, etc.

In light emitting apparatus 10, dam material 15 is formed in a ring shape enclosing around the plurality of LED chips 12, when viewed from above. Sealing member 13 (first sealing layer 13a, second sealing layer 13b, and phosphor layer 13c) is disposed in a region enclosed around by dam material 15. This achieves enhancement in efficiency of light emitting apparatus 10 in extracting light. It should be noted that dam material 15 may be formed in a ring shape having a rectangular outline.

Dam material 15 also has effects of substantially preventing light from lateral edges of LED chips 12 from passing external to light emitting apparatus 10. LED chips 12 emit light mainly in upward directions (toward sealing member 13). Since a large amount of yellow phosphor 14 comprising yellow light components are the lateral edges, light from the lateral edges often ends up not having a desired emission color. Dam material 15 serves as a wall against such light, thereby suppressing such light from leaking to the exterior of light emitting apparatus 10.

Sealing member 13 seals LED chips 12, bonding wires 17, and a portion of line 16. Sealing member 13, specifically, includes a translucent resin material comprising yellow phosphor 14 as a wavelength conversion material. The translucent resin material is, for example, a methyl-based silicone resin, but may be an epoxy resin or a urea resin, for example.

Yellow phosphor 14 is by way of example of phosphor (a phosphor particle), which is excited by light emitted by LED chip 12 in response to which emits yellow phosphor light. Yellow phosphor 14 is yttrium aluminum garnet (YAG)-based phosphor, for example.

According to this, a portion of blue light emitted by LED chips 12 is wavelength-converted into yellow light by yellow phosphor 14 included in sealing member 13. Then, a portion of blue light not absorbed by yellow phosphor 14 and the yellow light obtained by the wavelength-conversion by yellow phosphor 14 are diffused and mixed in sealing member 13. This allows sealing member 13 to emit white light.

Light emitting apparatus 10 includes sealing member 13 having a three-layer structure. Sealing member 13, specifically, includes first sealing layer 13a, second sealing layer 13b, and phosphor layer 13c.

Figure 5:
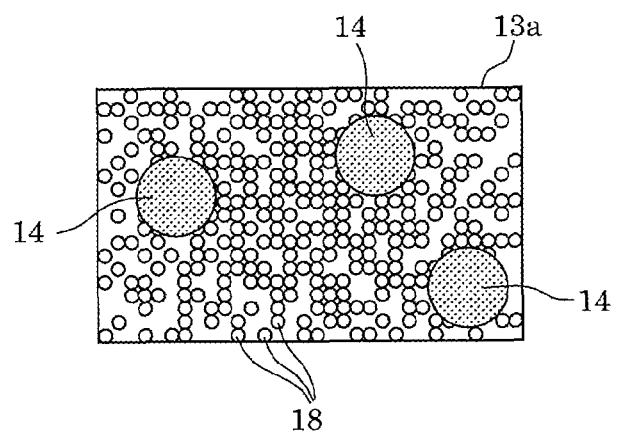
FIG. 5 is a schematic view showing the structure of a first sealing layer.

First, first sealing layer 13a is described, with further reference to FIG. 5. FIG. 5 is a schematic view showing the structure of first sealing layer 13a. It should be noted that FIG. 5 is merely a schematic view and does not precisely show shapes and particle sizes of yellow phosphor 14 and filler 18. First sealing layer 13a seals LED chips 12. As shown in FIG. 5, first sealing layer 13a comprises translucent resin material containing yellow phosphor 14 and filler 18.

Filler 18 is, for example, silica materials having particle sizes of about 10 nm. However, filler 18 may comprise any other material. In first sealing layer 13a, the resistance of filler 18 makes yellow phosphor 14 resistant to settle. As a result, yellow phosphor 14 is distributed within first sealing layer 13a.

First sealing layer 13a seals bonding wires 17, in addition to LED chips 12. In other words, first sealing layer 13a serves to protect LED chips 12 and bonding wires 17 from refuse, moisture, external force, etc. First sealing layer 13a serves to reduce effects of heat, generated by LED chips 12 emitting light, on phosphor layer 13c.

Next, second sealing layer 13b is described. Second sealing layer 13b is disposed above first sealing layer 13a. Second sealing layer 13b comprises a translucent resin material and very little yellow phosphor 14. Second sealing layer 13b is free of filler 18. Second sealing layer 13b included in sealing member 13 is in contact with the atmosphere, serving to reduce effects of moisture, contained in the atmosphere, on phosphor layer 13c.

Figure 6:
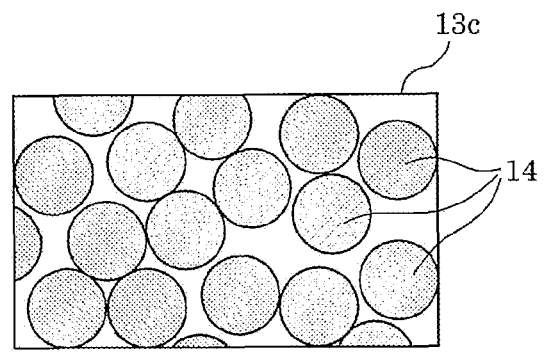
FIG. 6 is a schematic view showing the structure of a phosphor layer.

Next, phosphor layer 13c is described, with further reference to FIG. 6. FIG. 6 is a schematic view showing the structure of phosphor layer 13c.

Phosphor layer 13c contains yellow phosphor 14 and is disposed between first sealing layer 13a and second sealing layer 13b. As shown in FIG. 6, phosphor layer 13c is free of filler 18, while including yellow phosphor 14.

It should be noted that phosphor layer 13c is a layer in which yellow phosphor particles 14 are closely packed, and contains yellow phosphor 14 in higher density than first sealing layer 13a and second sealing layer 13b. In Embodiment 1, first sealing layer 13a contains yellow phosphor 14 in higher density than second sealing layer 13b.

[Effects]

It is contemplated that the primary reasons for the degradation of yellow phosphor 14 as described above in connection with conventional technology are the heat generated by LED chips 12 emitting light, and moisture in the atmosphere.

Here, as described above, phosphor layer 13c in which yellow phosphor particles 14 are closely packed is disposed between first sealing layer 13a and second sealing layer 13b in light emitting apparatus 10. In other words, phosphor layer 13c is disposed distant from LED chips 12 and the atmosphere. Thus, in light emitting apparatus 10, first sealing layer 13a reduces the effects of the heat, generated by LED chips 12 emitting light, on phosphor layer 13c, and second sealing layer 13b reduces the effects of moisture in the atmosphere on phosphor layer 13c.

In other words, light emitting apparatus 10 suppresses degradation yellow phosphor 14 included in phosphor layer 13c, i.e., suppresses shifting of chromaticity of yellow phosphor 14 due to use (energization).

It should be noted that the translucent resin material used for seal member 13 may be a phenyl-based or methylphenyl-based silicone resin which has gas barrier properties. It is contemplated that in such a case, sealing member 13, even if it has a single layer structure, can suppress the degradation of yellow phosphor 14 to some extent.

The phenyl-based or methylphenyl-based silicone resin, however, has properties that the elastic modulus decreases at high temperatures, and thus flaking of the resin is concerned. Moreover, properties that the phenyl-based silicone resin and the methylphenyl-based silicone resin are likely to brown are also a concern.

In contrast, a three-layer structure as that of light emitting apparatus 10 is advantageously applicable not only to the phenyl-based silicone resin and the methylphenyl-based silicone resin but also to the methyl-based silicone resin which has no concern as mentioned above.

[Method for Fabricating Light Emitting Apparatus]

Figure 7:
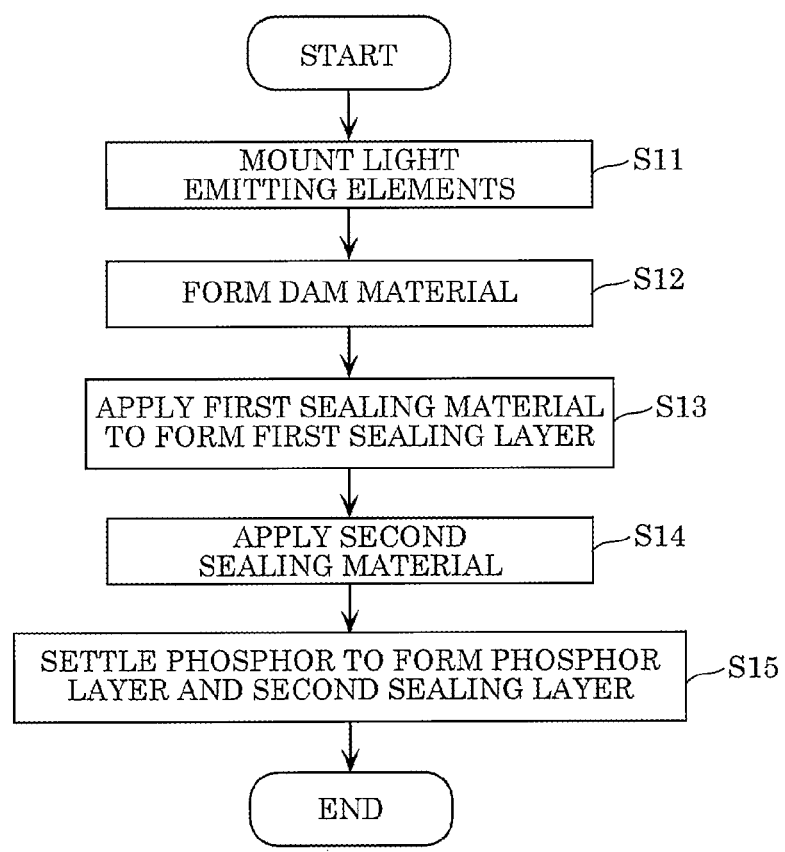
FIG. 7 is a flowchart illustrating a method for fabricating the light emitting apparatus according to Embodiment 1.
Figure 8:
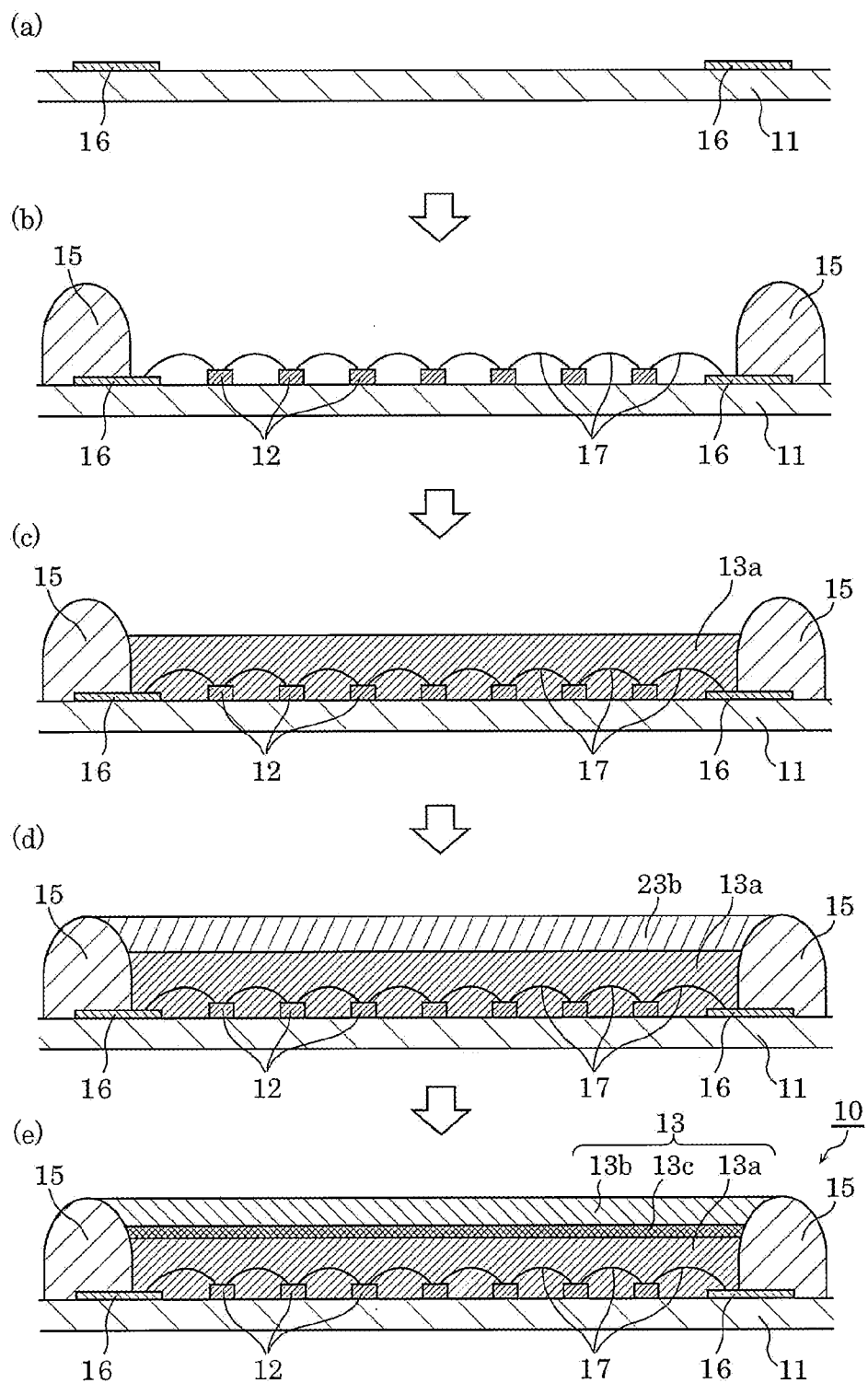
FIG. 8 shows schematic cross-sectional views illustrating the method for fabricating the light emitting apparatus according to Embodiment 1.

Next, a method for fabricating light emitting apparatus 10 is to be described. FIG. 7 is a flowchart illustrating the method for fabricating light emitting apparatus 10. FIG. 8 shows schematic cross-sectional views illustrating the method for fabricating light emitting apparatus 10. FIG. 8 shows sectional views of light emitting apparatus 10, taken along A-A in FIG. 2. It should be noted that the following fabrication method and sizes, etc., illustrated in the description below are by way of example.

First, as illustrated in (a) and (b) of FIG. 8, a plurality of LED chips 12 are mounted on substrate 11 (S11). LED chips 12 are die bonded using a die attach material or the like to mount them. At this time, the plurality of LED chips 12 are electrically connected with one another by bonding wires 17 and line 16. LED chips 12 have heights of about 0.2 mm and bonding wires 17 bulge upward by about 0.15 mm from the top surfaces of LED chips 12.

Then, dam material 15 is formed on the top surface of substrate 11 in a ring shape enclosing around the plurality of LED chips 12 (S12). Dam material 15 is formed, using a dispenser which discharges a white resin. Dam material 15 has a height of about 0.7 mm.

Next, as illustrated in (c) of FIG. 8, first sealing layer 13a for sealing LED chips 12 is formed (S13). Specifically, a first sealing material, which is a translucent resin material comprising yellow phosphor 14, is applied to (injected into) the region enclosed around by dam material 15. First sealing layer 13a has a thickness of about 0.5 mm to about 0.6 mm.

Next, as illustrated in (d) of FIG. 8, second sealing material 23b is applied onto first sealing layer 13a (S14). Second sealing material 23b is a translucent resin material comprising yellow phosphor 14. In other words, second sealing material 23b is a resin comprising yellow phosphor 14 and has translucency.

Next, as illustrated in (e) of FIG. 8, phosphor layer 13c and second sealing layer 13b are formed by allowing yellow phosphor 14 to settle in second sealing material 23b applied (S15). After a predetermined time followed by the application of second sealing material 23b, yellow phosphor 14 settles in second sealing material 23b. Here, since first sealing layer 13a comprises filler 18, the resistance of filler 18 makes yellow phosphor 14 in second sealing material 23b collected on first sealing layer 13a. As a result, phosphor layer 13c is formed on first sealing layer 13a, and second sealing layer 13b is formed on phosphor layer 13c. Phosphor layer 13c has a thickness of about 0.03 mm to about 0.10 mm. Second sealing layer 13b has a thickness of about 0.20 mm to about 0.25 mm.

Last, after step S15, the entirety of sealing member 13 is cured by being heated or exposed to light irradiation, for example.

It should be noted that in step S13, first sealing layer 13a can be cured and then phosphor layer 13c and second sealing layer 13b can be formed by the application of second sealing material 23b. This approach, however, forms an interface comprising a translucent resin material between first sealing layer 13a and phosphor layer 13c, which may decrease the efficiency of light emitting apparatus 10 in extracting light. Hence, desirably, the entirety of sealing member 13 is cured last as described above.

Moreover, the method for fabricating light emitting apparatus 10 is not limited to such a manner described above. For example, after first sealing layer 13a is formed, a phosphor sheet may be placed on first sealing layer 13a, and then second sealing layer 13b may be formed on the phosphor sheet. In this case, first sealing layer 13a, phosphor layer 13c, and second sealing layer 13b of sealing member 13 are formed in the listed order.

Moreover, filler 18 is, but not limited to be, included in first sealing layer 13a. For example, an aspect where first sealing layer 13a is free of filler 18 is contemplated for the method for fabricating light emitting apparatus 10 using the phosphor sheet as mentioned above.

[Supplementary]

Sealing member 13 of light emitting apparatus 10 has a three-layer structure in Embodiment 1 described above. However, light emitting apparatus 10 may have a two-layer structure of first sealing layer 13a and second sealing layer 13b stacked in listed order, wherein yellow phosphor 14 is settled on the bottom of second sealing layer 13b.

Moreover, while first sealing layer 13a comprises yellow phosphor 14 in Embodiment 1 described above, first sealing layer 13a may be free of yellow phosphor 14. However, if first sealing layer 13a comprises yellow phosphor 14, the light from LED chips 12 is diffused by yellow phosphor 14 included in first sealing layer 13a and reaches phosphor layer 13c, thereby enhancing the uniformity of light from light emitting apparatus 10. Desirably, first sealing layer 13a contains yellow phosphor 14 in that this achieves such advantageous effects. It should be noted that filler 18 also has effects of diffusing the light from LED chips 12.

While first sealing layer 13a and second sealing layer 13b comprise the same translucent resin material in Embodiment 1, it should be noted that they may comprise different resin materials. However, desirably, as described, first sealing layer 13a and second sealing layer 13b comprise the same translucent resin material and are cured after the application of second sealing material 23b in the above fabrication method since this has advantages effects that no interface comprising the translucent resin material is formed between first sealing layer 13a and phosphor layer 13c.

Embodiment 2

Figure 9:
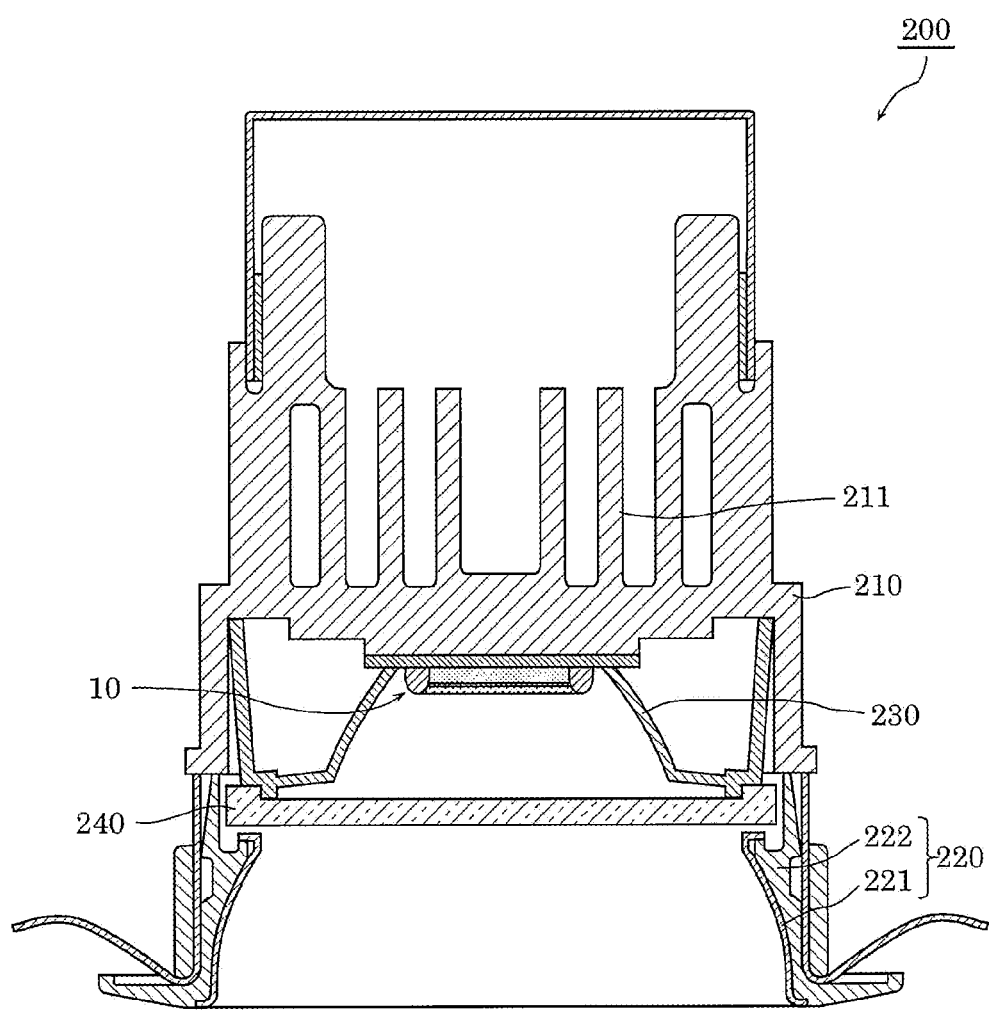
FIG. 9 is a sectional view of a lighting apparatus according to Embodiment 2.
Figure 10:
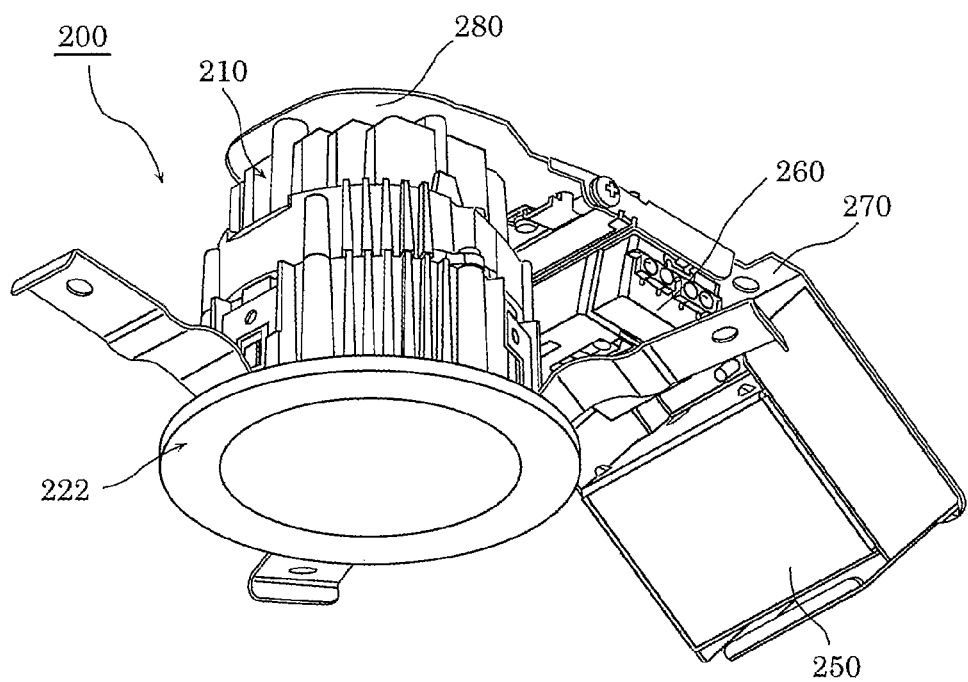
FIG. 10 is an external perspective view of the lighting apparatus and its peripheral components according to Embodiment 2.

Next, lighting apparatus 200 according to Embodiment 2 is to be described, with reference to FIGS. 9 and 10. FIG. 9 is a sectional view of lighting apparatus 200 according to Embodiment 2. FIG. 10 is an external perspective view of lighting apparatus 200 and its peripheral components according to Embodiment 2.

As shown in FIGS. 9 and 10, lighting apparatus 200 according to Embodiment 2 is, for example, a built-in lighting apparatus, such as a downlight, which is recessed into the ceiling in a house, for example, and emits light in a down direction (to a corridor, a wall, etc.).

Lighting apparatus 200 includes light emitting apparatus 10. Lighting apparatus 200 further includes a body having a substantially-closed-end cylindrical shape, configured of coupling base 210 and frame member 220 being coupled with each other, and reflector 230, and translucent panel 240 which are disposed on the body.

Base 210 is a mounting base on which light emitting apparatus 10 is mounted, serving also as a heat sink for dissipating heat generated by light emitting apparatus 10. Base 210 is formed in a substantially cylindrical shape, using a metallic material. Base 210 is an aluminum die cast product in Embodiment 2.

On top of base 210 (a portion on the ceiling side), a plurality of heat dissipating fins 211 extending upward are disposed, being spaced at regular intervals along a direction. This can efficiently dissipate the heat generated by light emitting apparatus 10.

Frame member 220 includes cone 221 having a substantially-cylindrical shape and a reflective inner surface, and frame body 222 on which cone 221 is mounted. Cone 221 is molded using a metallic material. Cone 221 can be formed by drawing or press forming of aluminum alloy, for example. Frame body 222 is molded of a rigid resin material or a metallic material. Frame member 220 is fixed by frame body 222 mounted on base 210.

Reflector 230 is a ring-shaped (a funnel-shaped) reflective member having internal reflectivity. Reflector 230 can be formed using a metallic material, such as aluminum, for example. It should be noted that reflector 230 may also be formed of, rather than a metallic material, a rigid white resin material.

Translucent panel 240 is a translucent member having light diffusibility and light translucency. Translucent panel 240 is a flat plate disposed between reflector 230 and frame member 220, and mounted onto reflector 230. Translucent panel 240 can be formed in a disk shape, using a transparent resin material, such as acrylic or polycarbonate.

It should be noted that lighting apparatus 200 may not include translucent panel 240. Lighting apparatus 200 not including translucent panel 240 improves luminous flux of the light emitted from lighting apparatus 200.

Also as shown in FIG. 10, lighting apparatus 200 is connected with illumination apparatus 250 which supplies light emitting apparatus 10 with illumination power, and terminal block 260 which relays an alternating-current power from mains supply to illumination apparatus 250.

Illumination apparatus 250 and terminal block 260 are fixed to mounting plate 270 provided separately from the body. Mounting plate 270 is formed by bending a rectangular plate member comprising a metallic material. Illumination apparatus 250 is fixed onto the undersurface of one end portion of mounting plate 270, and terminal block 260 is fixed onto the undersurface of the other end portion. Mounting plate 270 is connected with top plate 280 fixed on top of base 210 of the body.

With the inclusion of light emitting apparatus 10 in lighting apparatus 200, flaking of dam material 15 is suppressed. In other words, lighting apparatus 200 can be said to be a highly reliable lighting apparatus.

While the downlight is illustrated as the lighting apparatus according to the present disclosure in Embodiment 2, the present disclosure may be implemented as any other lighting apparatus, such as a spot light.

Other Embodiments

Light emitting apparatus 10 and the method for fabricating the same, and lighting apparatus 200 according to the exemplary embodiments of the present disclosure have been described above. However, the present disclosure is not limited to the above exemplary embodiments.

For example, while light emitting apparatus 10 having a COB structure is described in the above exemplary embodiments, the present disclosure is also applicable to a light emitting apparatus that has an SMD (surface mount device) structure. An SMD light emitting apparatus (a light emitting element) includes, for example, a resin housing having a recess, an LED chip mounted into the recess, and a sealing material (a phosphor containing resin) encapsulating recess. In this case, the sealing material encapsulating the recess may have a three-layer structure as described above.

Moreover, in the above exemplary embodiments, light emitting apparatus 10 provides white light by a combination of yellow phosphor 14 and LED chips 12 which emit blue light. However, the configuration for providing white light is not limited thereto.

For example, LED chips 12 and the phosphor-containing resin containing red phosphor and green phosphor may be combined. Alternatively, ultraviolet LED chips which emit ultra violet light having shorter wavelengths than LED chips 12, and blue phosphor, green phosphor, and red phosphor, which respectively emit blue light, red light, and green light by being excited mainly by ultra violet light, may be combined.

Moreover, in the above exemplary embodiments, the Chip To Chip connection is established between LED chips 12 mounted on substrate 11 through bonding wires 17. LED chips 12, however, may be connected to line 16 (a metal film) on substrate 11 by bonding wires 17, and electrically connected to one another via line 16.

Moreover, in the above exemplary embodiments, LED chips 12 are illustrated as light emitting elements included in light emitting apparatus 10. However, the light emitting element may be a semiconductor light emitting element, such as a semiconductor laser, or any other type of solid state light-emitting device, such as an electro luminescence (EL) element, including, for example, an organic EL element and an inorganic EL element.

Moreover, light emitting apparatus 10 may include two or more types of light emitting elements having different emission colors. For example, in addition to LED chips 12, light emitting apparatus 10 may include LED chips which emit red light, for the purposes of enhancing color rendering.

Moreover, the stack structure shown in the sectional views of the above exemplary embodiments is by way of example, and the present disclosure is not limited to the stack structure described above. In other words, in addition to the stack structure described above, any stack structure which can achieve the feature functionality of the present disclosure is also included within the scope of the present disclosure. For example, another layer may be disposed between the layers of the stack structure described above to an extent that can achieve the same or similar functionality of the stack structure described above.

Moreover, while the primary material included in each layer of the stack structure is illustrated in the above exemplary embodiments, each layer of the stack structure may also comprise another material to an extent that can achieve the same or similar functionality of the stack structure described above.

In other instances, various modifications to the exemplary embodiments according to the present disclosure described above that may be conceived by those skilled in the art and embodiments implemented by any combination of the components and functions shown in the exemplary embodiments are also included within the scope of the present disclosure, without departing from the spirit of the present disclosure.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light emitting apparatus comprising:
    a substrate;
    a light emitting element on the substrate;
    a first sealing layer sealing the light emitting element;
    a second sealing layer above the first sealing layer; and
    a phosphor layer containing phosphor, between the first sealing layer and the second sealing layer, wherein
    when the first sealing layer contains the phosphor, the phosphor contained in the phosphor layer has a higher density than the phosphor contained in the first sealing layer, and
    when the second sealing layer contains the phosphor, the phosphor contained in the phosphor layer has a higher density than the phosphor contained in the second sealing layer.

2. The light emitting apparatus according to claim 1, wherein
    the first sealing layer contains the phosphor.

3. The light emitting apparatus according to claim 1, wherein
    the first sealing layer contains a filler, and
    the second sealing layer is free of the filler.

4. The light emitting apparatus according to claim 1, wherein
    the first sealing layer and the second sealing layer comprise a same resin material.

5. The light emitting apparatus according to claim 1, further comprising
    a wire connected to the light emitting element to supply power to the light emitting element, wherein
    the first sealing layer further seals the wire.

6. The light emitting apparatus according to claim 1, further comprising
    a dam material enclosing around the light emitting element, wherein
    the first sealing layer, the second sealing layer, and the phosphor layer are formed in a region enclosed around by the dam material.

7. A lighting apparatus comprising the light emitting apparatus according to claim 1.

8. A method for fabricating a light emitting apparatus, comprising:
    (a) mounting a light emitting element on a substrate;
    (b) forming a first sealing layer sealing the light emitting element; and
    (c) forming a phosphor layer containing phosphor above the first sealing layer, and forming a second sealing layer above the phosphor layer, wherein
    when the first sealing layer contains the phosphor, the phosphor contained in the phosphor layer has a higher density than the phosphor contained in the first sealing layer, and
    when the second sealing layer contains the phosphor, the phosphor contained in the phosphor layer has a higher density than the phosphor contained in the second sealing layer.

9. The method according to claim 8, wherein
    in (c), the phosphor layer and the second sealing layer are formed by applying a translucent resin containing the phosphor onto the first sealing layer and allowing the phosphor to settle in the applied translucent resin.

* * * * *